(12) United States Patent
Kuboi

(10) Patent No.: US 9,437,636 B2
(45) Date of Patent: Sep. 6, 2016

(54) SOLID-STATE IMAGING ELEMENT, MANUFACTURING METHOD, AND ELECTRONIC DEVICE

(71) Applicant: Sony Corporation, Tokyo (JP)

(72) Inventor: Nobuyuki Kuboi, Kanagawa (JP)

(73) Assignee: Sony Corporation, Tokyo (JP)

( * ) Notice: Subject to any disclaimer, the term of this patent is extended or adjusted under 35 U.S.C. 154(b) by 94 days.

(21) Appl. No.: 14/550,625

(22) Filed: Nov. 21, 2014

(65) Prior Publication Data
US 2015/0155327 A1   Jun. 4, 2015

(30) Foreign Application Priority Data

Nov. 29, 2013   (JP) ................. 2013-247583

(51) Int. Cl.
*H01L 27/146*   (2006.01)
*H04N 5/359*   (2011.01)
*H04N 5/3745*   (2011.01)

(52) U.S. Cl.
CPC ....... *H01L 27/1463* (2013.01); *H01L 27/1464* (2013.01); *H01L 27/14612* (2013.01); *H01L 27/14621* (2013.01); *H01L 27/14623* (2013.01); *H01L 27/14627* (2013.01); *H01L 27/14638* (2013.01); *H01L 27/14685* (2013.01); *H01L 27/14689* (2013.01); *H04N 5/359* (2013.01); *H04N 5/3745* (2013.01)

(58) Field of Classification Search
CPC ................... H01L 27/1463; H01L 27/14638; H04N 5/359; H04N 5/3696; H04N 5/3745
See application file for complete search history.

(56) References Cited

U.S. PATENT DOCUMENTS

| | | | | |
|---|---|---|---|---|
| 7,492,027 B2* | 2/2009 | Mouli | ................. | H01L 27/1463 257/233 |
| 8,531,567 B2* | 9/2013 | Roy | .................. | H01L 27/14603 348/296 |
| 2007/0188635 A1* | 8/2007 | Yamaguchi | ....... | H01L 27/14621 348/272 |
| 2008/0248606 A1* | 10/2008 | Wilson | ................ | H01L 27/1463 438/73 |
| 2008/0303930 A1* | 12/2008 | Kuroda | ............. | H01L 27/14603 348/308 |
| 2012/0217601 A1* | 8/2012 | Miyanami | ......... | H01L 27/14621 257/432 |
| 2013/0037900 A1* | 2/2013 | Abe | .................. | H01L 27/14603 257/431 |
| 2015/0187826 A1* | 7/2015 | Suzuki | .............. | H01L 27/14625 348/281 |
| 2015/0221692 A1* | 8/2015 | Enomoto | .......... | H01L 27/14623 257/435 |
| 2015/0295005 A1* | 10/2015 | Tseng | ................ | H01L 27/14638 257/446 |

FOREIGN PATENT DOCUMENTS

JP   2012-175050 A   9/2012
JP   2013-128036 A   6/2013

* cited by examiner

*Primary Examiner* — Daniel M Pasiewicz
(74) *Attorney, Agent, or Firm* — Sheridan Ross P.C.

(57) ABSTRACT

A solid-state imaging element includes a semiconductor substrate where a plurality of photodiodes are arranged in a plane, and a separation section which separates the photodiodes, in which the separation section has a photoelectric conversion section formed by filling a material which has a high light absorption coefficient and a high quantum efficiency in trenches which are formed in the semiconductor substrate.

17 Claims, 16 Drawing Sheets

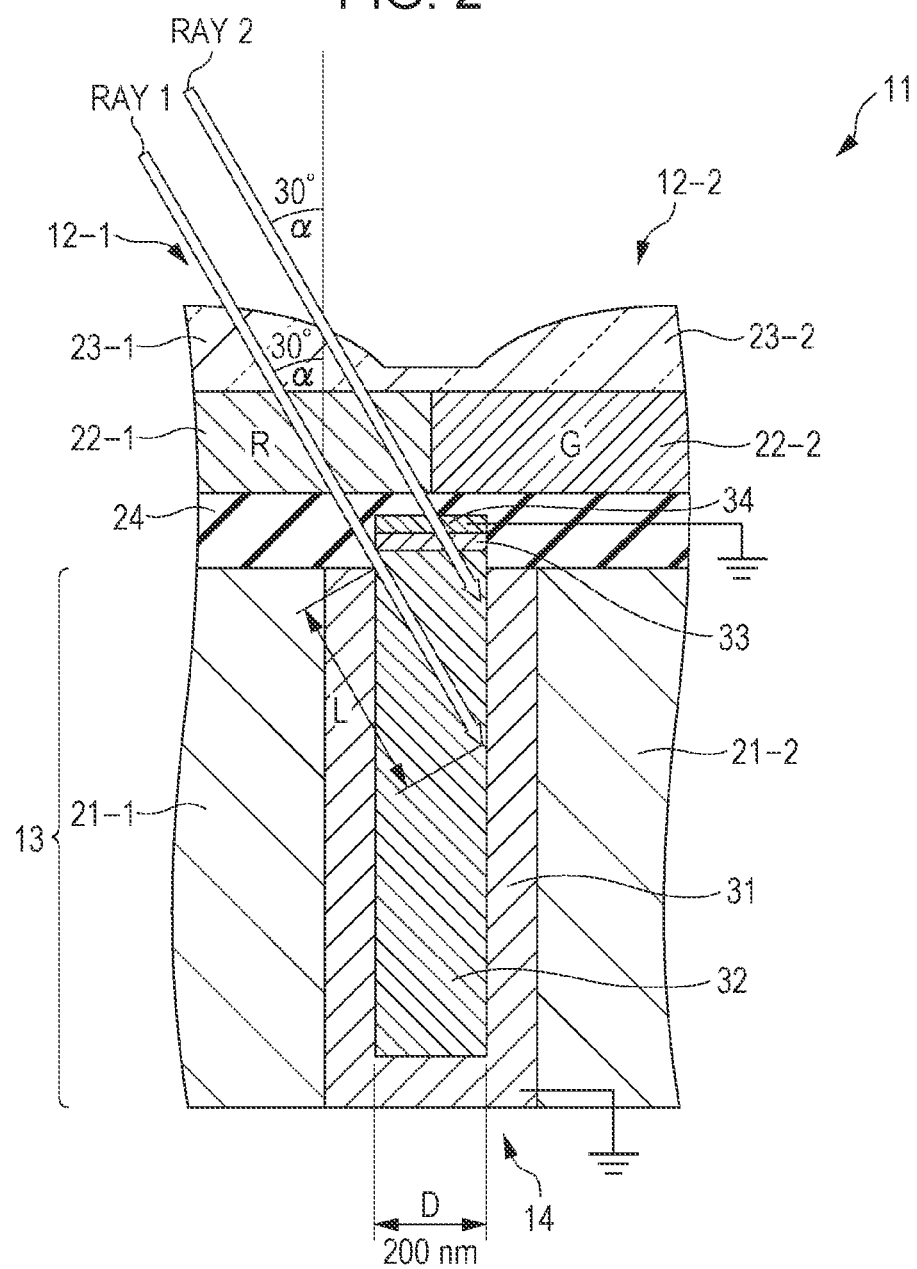

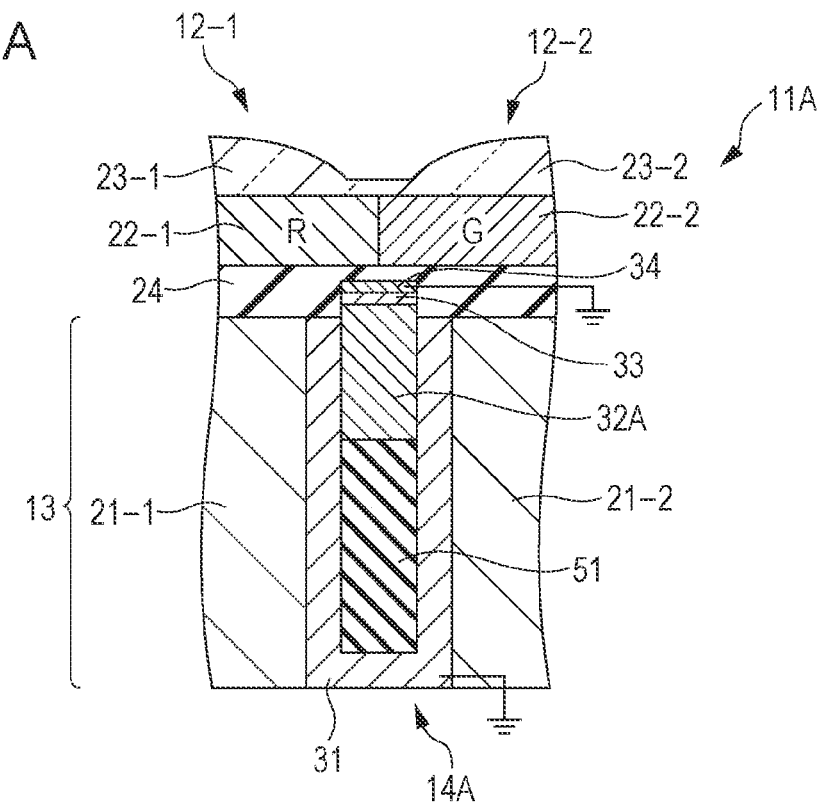
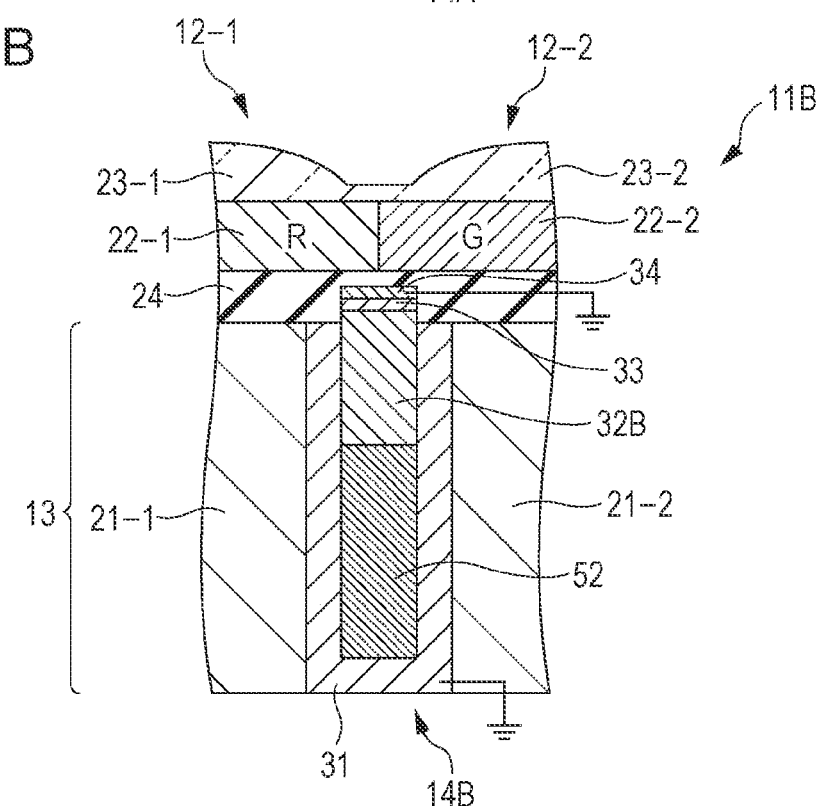

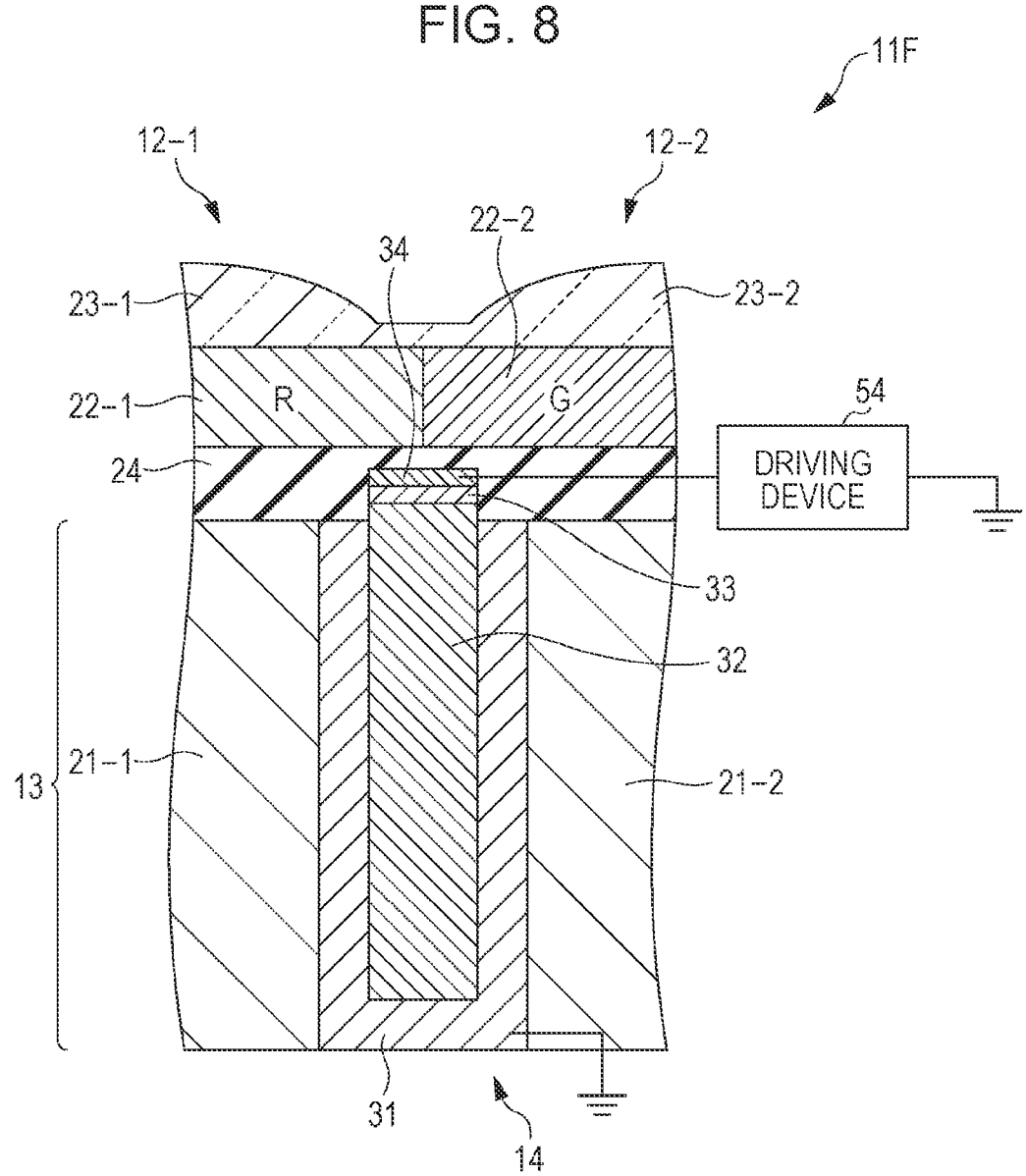

FIG. 10
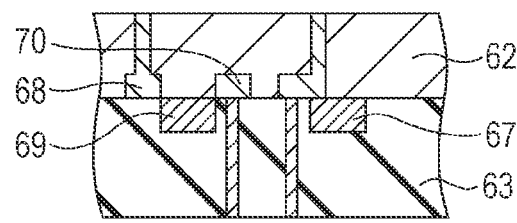
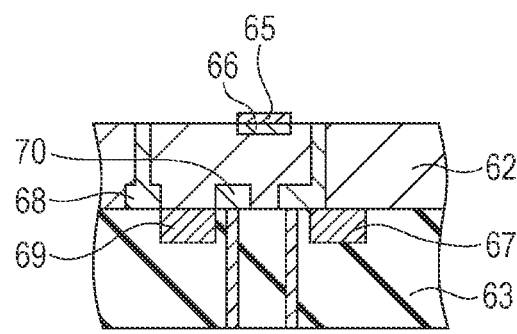
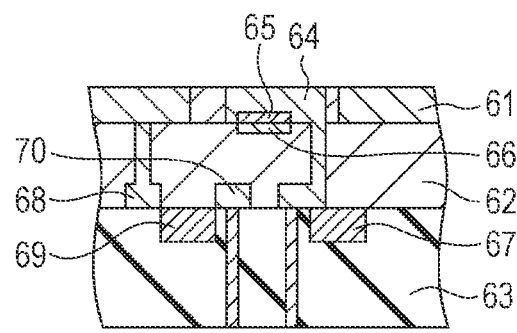

FIG. 11
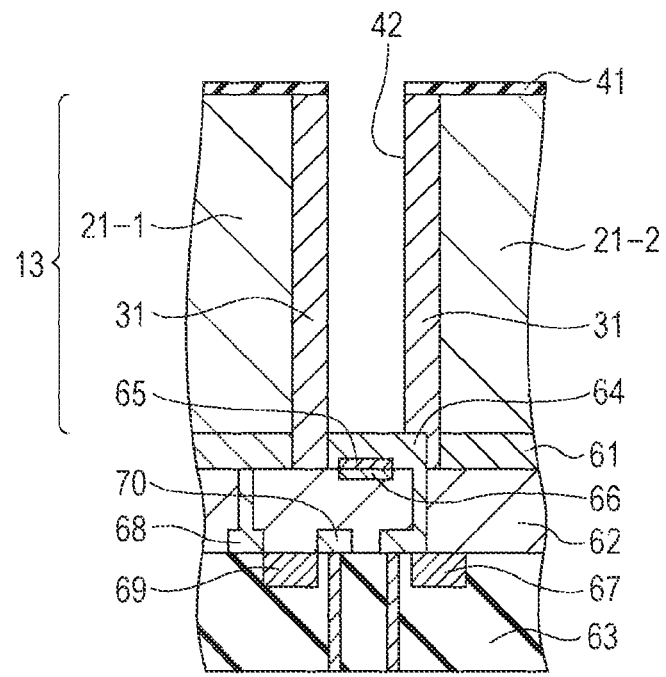
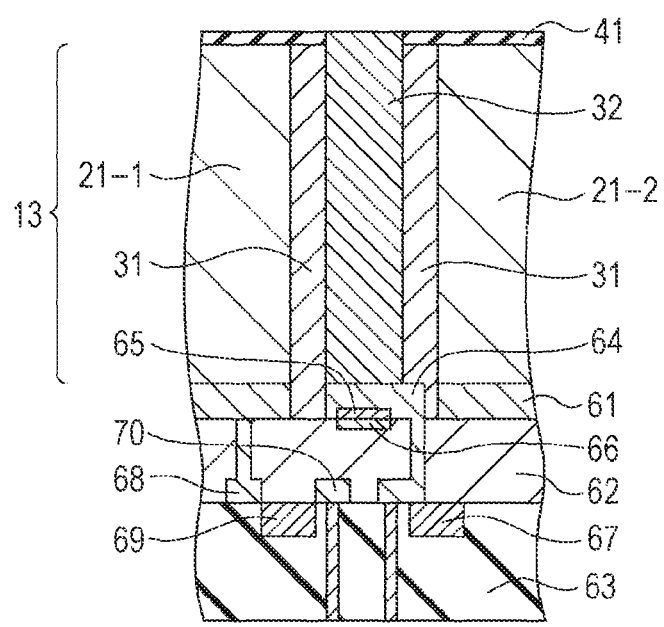

FIG. 12
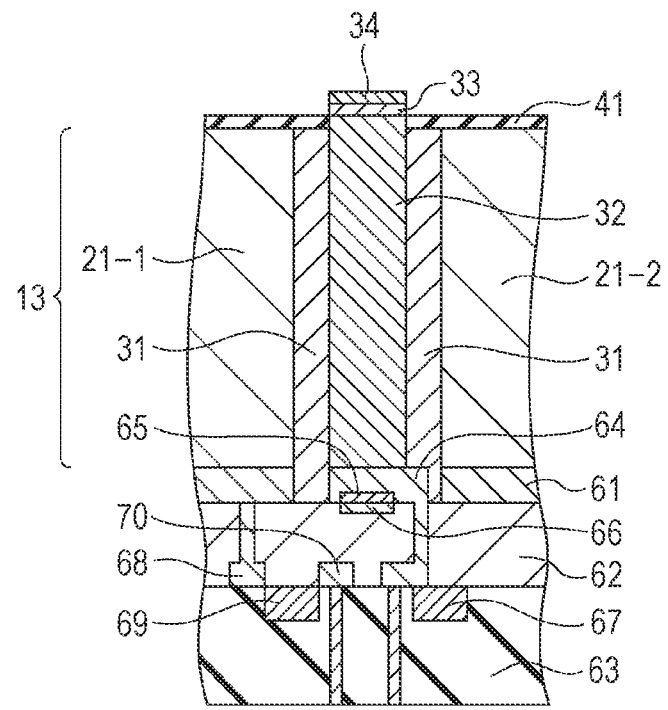
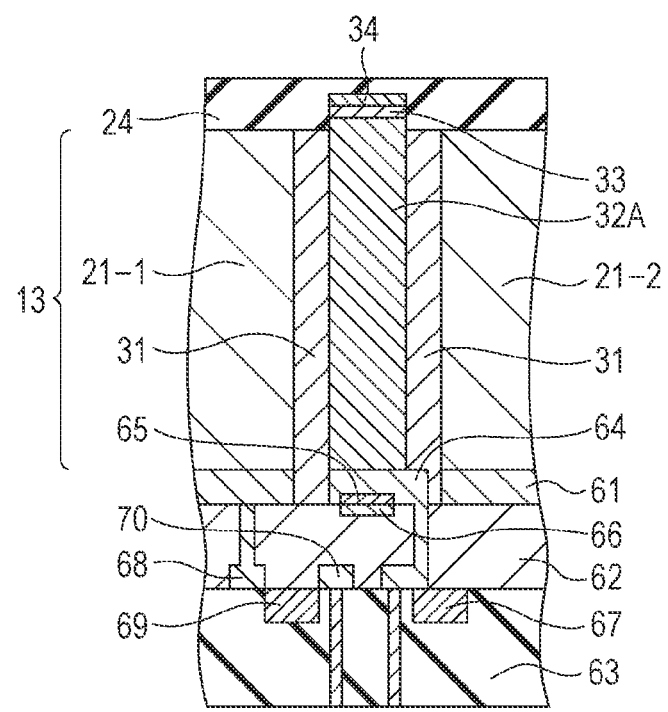

SOLID-STATE IMAGING ELEMENT, MANUFACTURING METHOD, AND ELECTRONIC DEVICE

CROSS REFERENCE TO RELATED APPLICATIONS

This application claims the benefit of Japanese Priority Patent Application JP 2013-247583 filed Nov. 29, 2013, the entire contents of which are incorporated herein by reference.

BACKGROUND

The present disclosure relates to a solid-state imaging element, a manufacturing method, and an electronic device, in particular, to a solid-state imaging element, a manufacturing method, and an electronic device where it is possible to obtain images with a more favorable image quality.

In the related art, for example, solid-state imaging elements such as Charge Coupled Device (CDD) or Complementary Metal Oxide Semiconductor (CMOS) image sensors are used in electronic devices which are provided with an imaging function such as a digital still camera or a digital video camera. The solid-state imaging elements have pixels where a photodiode (PD) which performs photoelectric conversion and a plurality of transistors are combined and images are constructed based on pixel signals which are output from a plurality of pixels which are arranged in a plane.

Such solid-state imaging elements are configured such that the pixels are physically separated from each other. For example, the separation between the pixels may be performed using a structure where trenches are cut out between the pixels and an insulation film, organic material, metal material, or the like is filled in the trenches.

For example, the present applicant proposed an imaging element where a pixel separation region is formed with a structure where trenches are cut out between the pixels by dry etching, a fixed charge film and an insulation film are formed in the trenches, and a light shielding film is filled in thereon (refer to Japanese Unexamined Patent Application Publication No. 2013-128036).

In the imaging element, for example, hafnium ($HfO_2$) or the like is used as the fixed charge film and either of a metal material (Ti, W, Ta, Al) or a black material (carbon black, TiO, FeO) is used as the light shielding film. Due to this, in the imaging element, it is possible to suppress generation of color mixing by reflecting or absorbing obliquely incident light, which is a mixed color component, in the pixel separation region.

Furthermore, the present applicant proposed an imaging element where a pixel separation region is formed with a structure where an inorganic material which absorbs light or a photosensitive resin which includes a black pigment is filled in trenches and a metal light shielding film (W, Ti) is formed on top of the trenches (refer to Japanese Unexamined Patent Application Publication No. 2012-175050).

In the imaging element, for example, by adopting a configuration which uses an inorganic material, it is possible to absorb light with a short wavelength in the blue color region which is not able to be shielded by a light shielding film of an upper layer using a wide band gap of the inorganic material, and it is possible to reduce color mixing. In addition, by adopting a configuration which uses a photosensitive resin, it is possible to selectively absorb incident light up to a long wavelength in addition to the short wavelength by changing the composition of an organic film, and it is possible to reduce color mixing.

SUMMARY

As described above, in the imaging elements in Japanese Unexamined Patent Application Publication No. 2013-128036 and Japanese Unexamined Patent Application Publication No. 2012-175050, the pixel separation region is formed with a configuration where an insulation film, metal, or an organic material which reflects or absorbs light is filled in between the pixels. However, in such a configuration, there is a concern that image quality deterioration such as flare or ghosting will be promoted due to the influence of the reflected light reflected by the metal material being incident again on the optical system.

In addition, with an organic material such as a photosensitive resin, a wide trench width of, for example, approximately 0.5 μm or more is necessary in order to exhibit a sufficient absorption performance by setting the pixel separation of pixels to approximately 1 μm in practice, and there is a concern that it will not be possible to sufficiently deal with the micronization of the pixels.

Accordingly, in order to avoid adverse influence due to the reflection of incident light or to deal with the micronization of the pixels, a pixel separation region with a configuration which prevents the reflection of light which is incident onto the pixel separation region and where it is possible to absorb light with a narrower width is necessary. Due to this, there is a demand for an imaging element where, in addition to suppressing color mixing, it is possible to obtain an image with a more favorable image quality by avoiding the adverse influence due to the reflection of incident light and dealing with the micronization of the pixels.

It is desirable to obtain an image with a more favorable image quality.

According to one embodiment of the present disclosure, there is provided a solid-state imaging element including a semiconductor substrate where a plurality of photodiodes are arranged in a plane, and a separation section which separates the photodiodes, in which the separation section has a photoelectric conversion section formed by filling a material which has a high light absorption coefficient and a high quantum efficiency in trenches which are formed in the semiconductor substrate.

According to another embodiment of the present disclosure, there is provided a method for manufacturing a solid-state imaging element which is provided with a semiconductor substrate where a plurality of photodiodes are arranged in a plane and a separation section which separates the photodiodes, the method including forming trenches in the semiconductor substrate when forming the separation section, and forming a photoelectric conversion section by filling a material which has a high light absorption coefficient and a high quantum efficiency in the trenches.

According to still another embodiment of the present disclosure, there is provided an electronic device including a solid-state imaging element which is provided with a semiconductor substrate where a plurality of photodiodes are arranged in a plane, and a separation section which separates the photodiodes, in which the separation section has a photoelectric conversion section formed by filling a material which has a high light absorption coefficient and a high quantum efficiency in trenches which are formed in the semiconductor substrate.

In the embodiment, the separation section has a photoelectric conversion section which is formed by filling a material which has a high light absorption coefficient and a high quantum efficiency in trenches which are formed in the semiconductor substrate.

According to the embodiments of the present disclosure, it is possible to obtain an image with a more favorable image quality.

BRIEF DESCRIPTION OF THE DRAWINGS

FIG. 2 is a diagram which illustrates light absorption capacity in a pixel separation section;

FIGS. 5A and 5B are diagrams which show configuration examples of second and third embodiments of the solid-state imaging element;

FIG. 8 is a diagram which shows a configuration example of a seventh embodiment of the solid-state imaging element;

FIG. 10 is a diagram which illustrates a method for manufacturing the solid-state imaging element;

FIG. 11 is a diagram which illustrates a method for manufacturing the solid-state imaging element;

FIG. 12 is a diagram which illustrates a method for manufacturing the solid-state imaging element;

DETAILED DESCRIPTION OF EMBODIMENTS

Below, detailed description will be given of specific embodiments applying the present technique with reference to the drawings.

Figure 1:
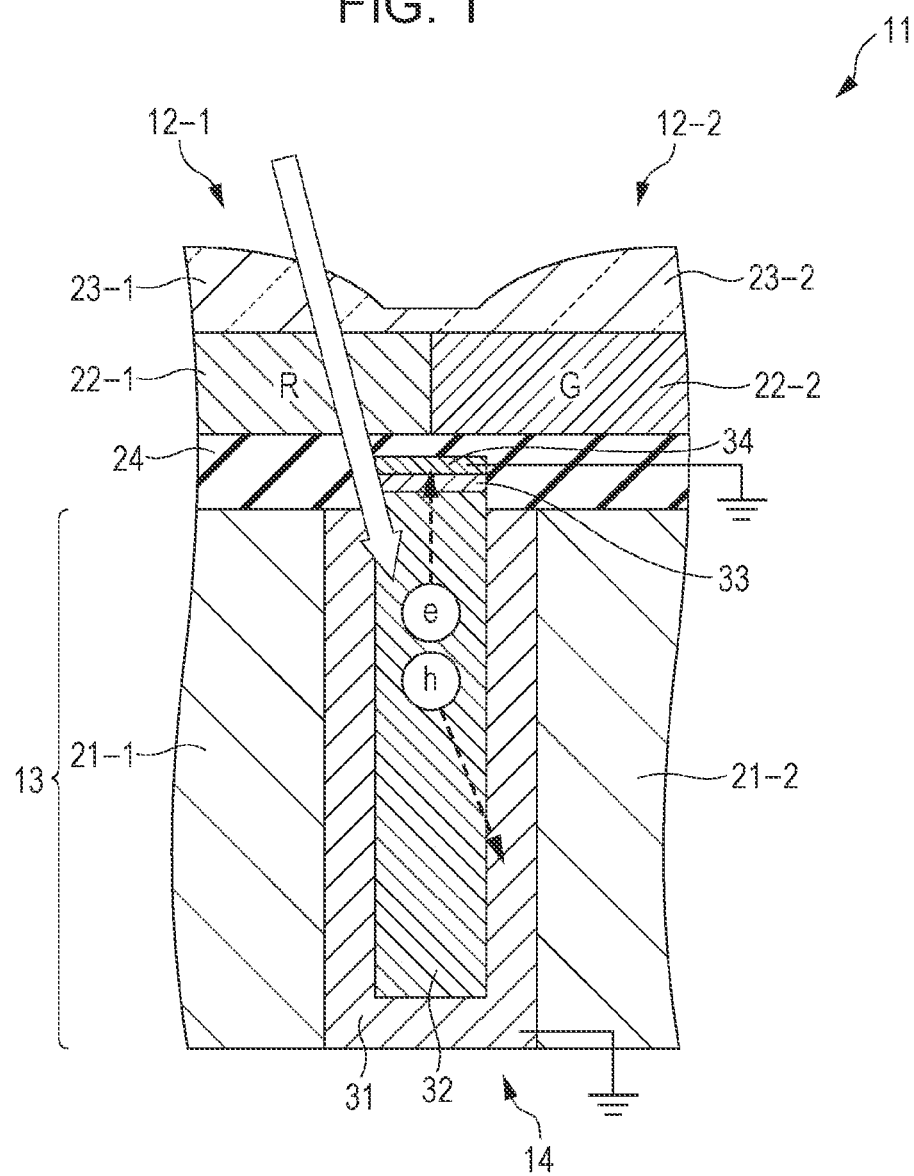
FIG. 1 is a diagram which shows a configuration example of a first embodiment of a solid-state imaging element applying the present technique.

FIG. 1 is a diagram which shows a configuration example of a first embodiment of a solid-state imaging element applying the present technique.

A solid-state imaging element 11 is configured by a plurality of pixels 12 being arranged in a plane in an array form and a pixel separation section 14 is formed in a semiconductor substrate 13 in order to separate each of the pixels 12. FIG. 1 shows a cross-sectional configuration example of the solid-state imaging element 11 at the pixel separation section 14 which separates two pixels 12-1 and 12-2.

The pixel 12-1 has a PD 21-1, a color filter 22-1, and a microlens 23-1 and the pixel 12-2 has a PD 21-2, a color filter 22-2, and a microlens 23-2. In this manner, the pixels 12-1 and 12-2 are configured in the same manner and when it is not necessary to distinguish therebetween, these will be appropriately referred to below as pixels 12 and the same applies to each of the sections which configure the pixels 12. In addition, an insulation layer 24 is laminated between the semiconductor substrate 13 where the PD 21 of the pixel 12 is formed, and the color filter 22.

The PD 21 is configured by a PN bond which is formed inside the semiconductor substrate 13 and generates an electrical charge according to the amount of light received by performing photoelectric conversion using the light which is received.

The color filter 22 is a filter which transmits light with a predetermined color for each of the pixels 12. For example, the color filter 22-1 transmits light with a red color (R) and the color filter 22-2 transmits light with a green color (G). In addition, the color filter 22 is formed, for example, such that the film thickness is approximately 800 nm. Here, the film thickness is not limited to this value.

The microlens 23 concentrates light which is irradiated onto the PD 21 for each of the pixels 12.

The insulation layer 24 insulates the surface of the semiconductor substrate 13. The insulation layer 24 is formed by silicon nitride (SiN) or the like, for example, such that the film thickness is approximately 500 nm. Here, the film thickness is not limited to this value.

The pixel separation section 14 has a photoelectric conversion film 32 which is arranged between the pixels 12-1 and 12-2, a P-type doped layer 31 which is formed in the semiconductor substrate 13 so as to surround the periphery of the photoelectric conversion film 32, a buffer layer 33 which is laminated on the photoelectric conversion film 32, and a transparent electrode 34.

The P-type doped layer 31 is formed by adding P-type impurities (for example, boron) with respect to the semiconductor substrate 13 and is provided so as to surround the periphery (the side surfaces and the bottom surface) of the photoelectric conversion film 32.

The photoelectric conversion film 32 is formed, for example, by processing trenches with a narrow width of approximately 200 nm between the pixels 12 by dry etching and then filling a substance which has a high light absorption coefficient (a predetermined high light absorption coefficient) and a high quantum efficiency (a predetermined high quantum efficiency) in the trenches, for example, a compound semiconductor which has a chalcopyrite structure, a group III-V compound semiconductor, or the like. Here, it is possible to use, for example, CIGS (a compound of copper, indium, gallium, and selenium) as the substance which has a high light absorption coefficient and a high quantum efficiency and it is possible to control the absorption wavelength by changing the blending ratio of indium and gallium. In addition, the CIGS is able to realize a quantum efficiency which is nearly twice that of silicon (Si) according to the blending ratio or the film-forming conditions.

The buffer layer 33 is formed by a material with a high resistance which is laminated on the upper section of the photoelectric conversion film 32, for example, a cadmium sulfide (CdS) film. Here, the buffer layer 33 is provided in order to efficiently extract photoelectrons, which are generated inside the photoelectric conversion film 32 by photoelectric conversion, from the transparent electrode 34 and, for example, the configuration may not have the buffer layer 33.

The transparent electrode 34 is formed by a transparent material which has conductivity which is laminated on the upper section of the buffer layer 33, for example, an Indium Tin Oxide (ITO) film.

Then, in the pixel separation section 14, the P-type doped layer 31 which covers the side surfaces and bottom surface of the photoelectric conversion film 32 is connected with the ground and the upper surface of the photoelectric conversion film 32 (the end surface on the insulation layer 24 side) is also connected with the ground via the buffer layer 33 and the transparent electrode 34.

The pixel separation section 14 is configured in this manner and the light which is incident on the pixel separation section 14 from the oblique direction as illustrated by a white arrow in the diagram undergoes photoelectric conversion in the photoelectric conversion film 32. Then, before recombination of the photoelectrons and positive holes (holes) which are generated by photoelectric conversion occurs, the photoelectrons are extracted from the photoelectric conversion film 32 via the transparent electrode 34 and the positive holes are also extracted from the photoelectric conversion film 32 via the P-type doped layer 31.

That is, since a compound semiconductor which has a chalcopyrite structure or a group III-V compound semiconductor which configures the photoelectric conversion film 32 are direct transition semiconductors, visible light is emitted to the periphery by recombination radiation due to the photoelectrons and the positive holes which are generated in the photoelectric conversion film 32. Accordingly, in order to prevent deterioration of color mixing due to the visible light being incident again on the pixels 12 at the periphery, it is necessary to extract these from the photoelectric conversion film 32 before recombination of the photoelectrons and the positive holes (holes) occurs. Here, for example, since the photoelectrons and the positive holes are mainly changed to heat (lattice vibration) in an indirect transition substance such as silicon, light is generally not generated by the recombination of the photoelectrons and positive holes and it is not necessary to take this light into consideration.

In this manner, it is possible to absorb incident light from the oblique direction in the pixel separation section 14 in the solid-state imaging element 11 and it is possible to suppress the generation of color mixing.

Next, with reference to FIG. 2, description will be given of the light absorption capacity in the pixel separation section 14 with a configuration where CIGS is used in the photoelectric conversion film 32 as an example.

As shown in FIG. 2, a light path L of the incident light which passes through the inside of the photoelectric conversion film 32, a film thickness D (a trench width) of the photoelectric conversion film 32, and an incident angle α of the incident light have a relationship which is represented by the following formula (1) from a geometric relationship.

$$\frac{D}{L} = \sin\alpha \quad (1)$$

Here, when the film thickness D of the photoelectric conversion film 32 is set to 200 nm and the incident angle α of the incident light is set to 30 degrees, the light path L of the incident light which reaches from one side surface of the photoelectric conversion film 32 to the other side surface is able to be calculated as 400 nm according to formula (1), as with a ray 1 shown in FIG. 2. Then, when the light path L (=400 nm) is converted into the silicon film thickness using the wavelength dependence of the absorption coefficient of the photoelectric conversion film 32 which uses CIGS, 8 µm is calculated in the blue color region (a wavelength of 400 nm). In the same manner, 12 µm is calculated in the green color region (a wavelength of 550 nm) and 36 µm in the red color region (a wavelength of 650 nm). Here, as obliquely incident resistance, 30 degrees is selected as a guide for the incident angle α of the incident light. In the same manner, as with a ray 2 shown in FIG. 2, the light path L of the incident light which is incident from the end section of the microlens 23 is ½ of the value which is calculated for the ray 1 described above.

In this manner, the light path L of the incident light which is incident in the oblique direction is a greater value than the film thickness when it is considered that the film thickness of the semiconductor substrate 13 (Si) which configures the pixels 12 of the solid-state imaging element 11 is approximately 3 µm. Accordingly, it is possible to sufficiently absorb incident light in each of the wavelength bands in the photoelectric conversion film 32 in the solid-state imaging element 11 and it is possible to determine that the light absorption capacity according to the photoelectric conversion film 32 is effective.

In this manner, in the solid-state imaging element 11, it is possible to absorb light which is incident between the pixels 12 according to the photoelectric conversion film 32 with a film thickness which is thinner than in the related art without reflecting the incident light to the pixel separation section 14 and it is possible to suppress generation of color mixing.

Accordingly, the solid-state imaging element 11 is able to deal with the micronization of the pixels 12 in addition to being able to avoid adverse influence due to the reflection of the incident light. In this manner, the solid-state imaging element 11 is able to improve the color reproducibility of a color image at the time of shooting by being able to reduce color mixing which corresponds to the micronization of the pixels 12, and it is possible to obtain an image with higher resolution.

Next, description will be given of a planar configuration example of the pixel separation section 14 with reference to FIGS. 3A and 3B.

Figure 3A:
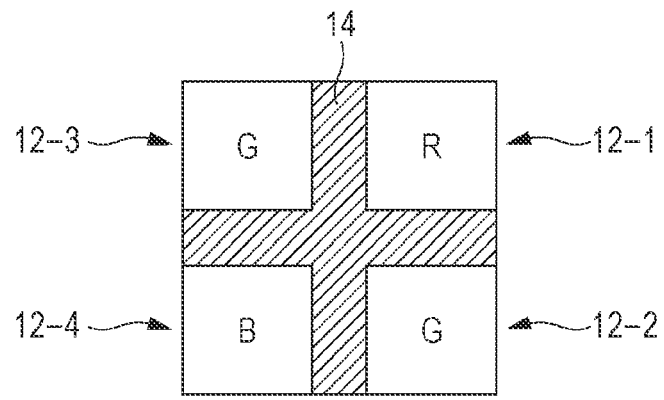
FIGS. 3A and 3B are diagrams which show a planar configuration example of a pixel separation section.
Figure 3B:
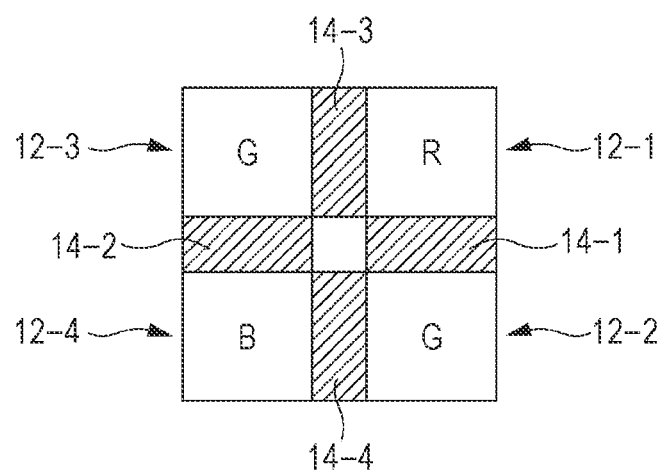

FIGS. 3A and 3B show a planar configuration example of the pixel separation section 14 which separates four pixels 12-1 to 12-4. For example, the size of the pixels 12 of the solid-state imaging element 11 is a square where the length of the sides is 1.2 µm when viewed in a plane.

For example, as shown in FIG. 3A, the pixel separation section 14 is able to have a cross configuration where the portion which separates the pixels 12-1 and 12-3 from the pixels 12-2 and 12-4 and extends in the horizontal direction and the portion which separates the pixels 12-1 and 12-2 from the pixels 12-3 and 12-4 and extends in the orthogonal direction are connected so as to intersect.

In addition, for example, as shown in FIG. 3B, the pixel separation section 14 is able to have a divided structure where the pixel separation section 14-1 which separates the pixels 12-1 and 12-2, the pixel separation section 14-2 which separates the pixels 12-3 and 12-4, the pixel separation section 14-3 which separates the pixels 12-1 and 12-3, and the pixel separation section 14-4 which separates the pixels 12-2 and 12-4 are each divided.

Figure 4:
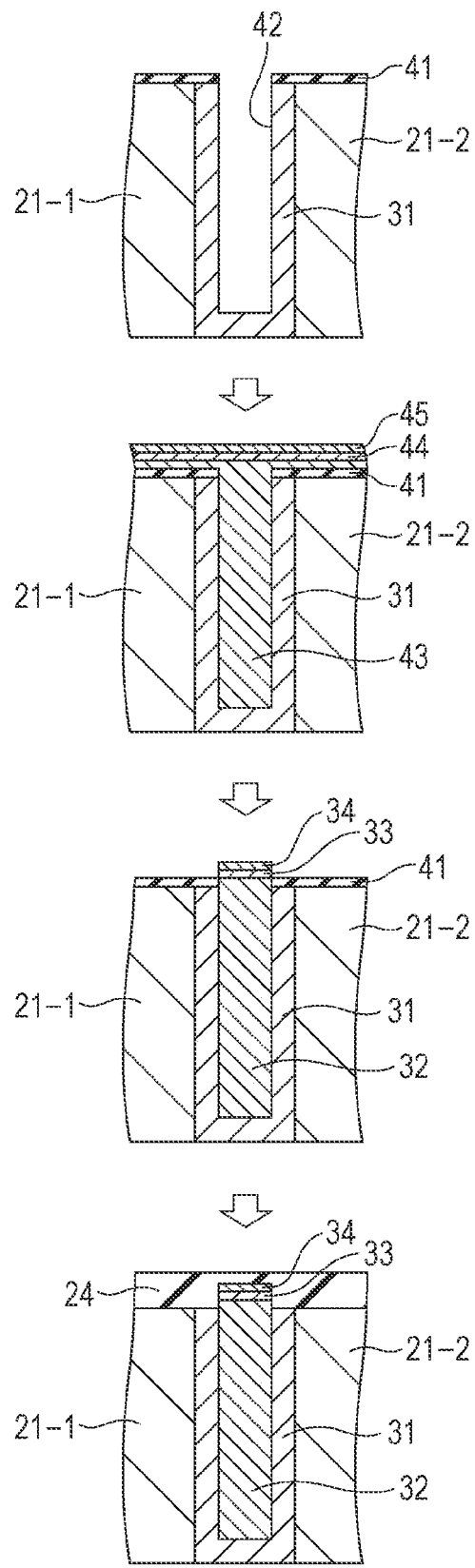
FIG. 4 is a diagram which illustrates a method for manufacturing a solid-state imaging element.

Next, description will be given of a method for manufacturing the solid-state imaging element 11 with reference to FIG. 4.

Firstly, the P-type doped layer 31 is formed in a first step.

For example, boron is ion-implanted at, for example, a concentration of $10^{15}/cm^3$ in the region where the pixel separation section 14 is formed between the pixels 12-1 and 12-2 in the semiconductor substrate 13. Then, an insulation film 41 is formed by film-forming silicon nitride by chemical vapor deposition (CVD) with respect to the surface of the semiconductor substrate 13. After that, for example, a photoresist mask (which is not shown in the diagram) with a film thickness of 500 nm is formed by lithography and a trench 42 with a depth of 2 μm and a width of 200 nm is formed by dry etching. Here, the size of the trench 42 is an example and the trench 42 is not limited to this size. Due to this, the P-type doped layer 31 is formed at the side surfaces and bottom surface of the trench 42.

Here, regarding the processing conditions of the etching for forming the trench 42, the bias frequency is set to 60/13.56 MHz, the gas type and flow rate are set to C4F8/SF6=200/200 sccm, the pressure is set to 30 mTorr, the substrate temperature is set to 60 degrees, a substrate bias voltage Vpp is set to 200 V, and the processing time is set to 150 seconds. Here, the processing conditions are examples and the etching for forming the trench 42 is not limited to these processing conditions.

Next, one layer of CIGS 43 is filled inside the trench 42 in a second step. At this time, a film of CIGS 43 is also formed on the surface of the insulation film 41, a CdS film 44 is film-formed on the film of CIGS 43, and an ITO film 45 is also film-formed.

For example, the CIGS 43 is filled inside the trench 42 by a metal organic chemical vapor deposition (MOCVD) method and the CdS film 44 is film-formed by a solution growth method or a sputtering method. In addition, the ITO film 45 is film-formed by a sputtering method and the process conditions are such that the gas type and flow rate are set to Ar/O2=100/2 sccm, the pressure is set to 2 mTorr, the substrate temperature is set to 27 degrees, the substrate bias voltage Vpp is set to 400 V, and the processing time is set to 400 seconds. Here, the processing conditions are an example and the sputtering method for film-forming the ITO film 45 is not limited to these processing conditions. In addition, other than the CIGS 43, a compound which has a chalcopyrite structure or a group III-V compound may be filled in the trench 42.

Next, in a third step, a photoresist mask is formed by lithography and the transparent electrode 34, the buffer layer 33, and the photoelectric conversion film 32 are formed by etching the ITO film 45, CdS film 44, and CIGS 43 up to the insulation film 41 by an etch back process.

Then, in a fourth step, the insulation layer 24 is formed by further film-forming silicon nitride by CVD with respect to the insulation film 41.

After that, the solid-state imaging element 11 is manufactured by forming the color filter 22 and the microlens 23 as shown in FIG. 1.

Next, FIGS. 5A and 5B are diagrams which show a configuration example of second and third embodiments of the solid-state imaging element 11.

As shown in FIGS. 5A and 5B, a solid-state imaging element 11A which is the second embodiment and a solid-state imaging element 11B which is the third embodiment have different configurations to the solid-state imaging element 11 in FIG. 1 in the point that the inside of the trench has a double-layered structure. Here, the other portions of the solid-state imaging elements 11A and 11B are configured in the same manner as the solid-state imaging element 11 in FIG. 1, the same reference numerals are used for the common components, and detailed description thereof will be omitted.

For example, a pixel separation section 14A of the solid-state imaging element 11A has a double-layered structure of a photoelectric conversion film 32A and an insulation film 51. That is, the solid-state imaging element 11A is configured by the insulation film 51 of, for example, silicon dioxide (SiO$_2$), silicon nitride film (SiN), silicon carbon nitride (SiCN), or silicon oxycarbide (SiOC), or the like being filled in a portion which is deeper than the predetermined depth of the trench which is formed in the pixel separation section 14A and the photoelectric conversion film 32A being filled in the upper section of the insulation film 51.

In addition, a pixel separation section 14B of the solid-state imaging element 11B has a double-layered structure of a photoelectric conversion film 32B and a metal material 52. That is, the solid-state imaging element 11B is configured by the metal material 52 which is, for example, tungsten (W), titanium (Ti), tantalum (Ta), aluminum (Al), or the like being filled in the portion which is deeper than the predetermined depth of the trench which is formed in the pixel separation section 14B and the photoelectric conversion film 32B being filled in the upper section of the metal material 52.

In the solid-state imaging element 11A or 11B which is configured in this manner, it is possible to absorb the incident light from the oblique direction by photoelectric conversion in the photoelectric conversion film 32A or 32B at the upper layer side of the pixel separation section 14A or 14B and to suppress generation of color mixing. Furthermore, in the solid-state imaging element 11A or 11B, it is possible to physically prevent the color mixing due to electrons caused inside the PD 21, by the insulation film 51 or the metal material 52.

Here, the photoelectric conversion films 32A and 32B are configured by a compound which has a chalcopyrite structure such as CIGS or a group III-V compound in the same manner as the photoelectric conversion film 32. In addition, a double-layered structure may be used where, for example, an organic film such as a photosensitive resin which includes a black pigment is filled in instead of the insulation film 51 and the metal material 52. In addition, it is favorable that the depth of the photoelectric conversion films 32A and 32B be 400 nm or more. However, the depth is not limited to 400 nm or more.

Figure 6:
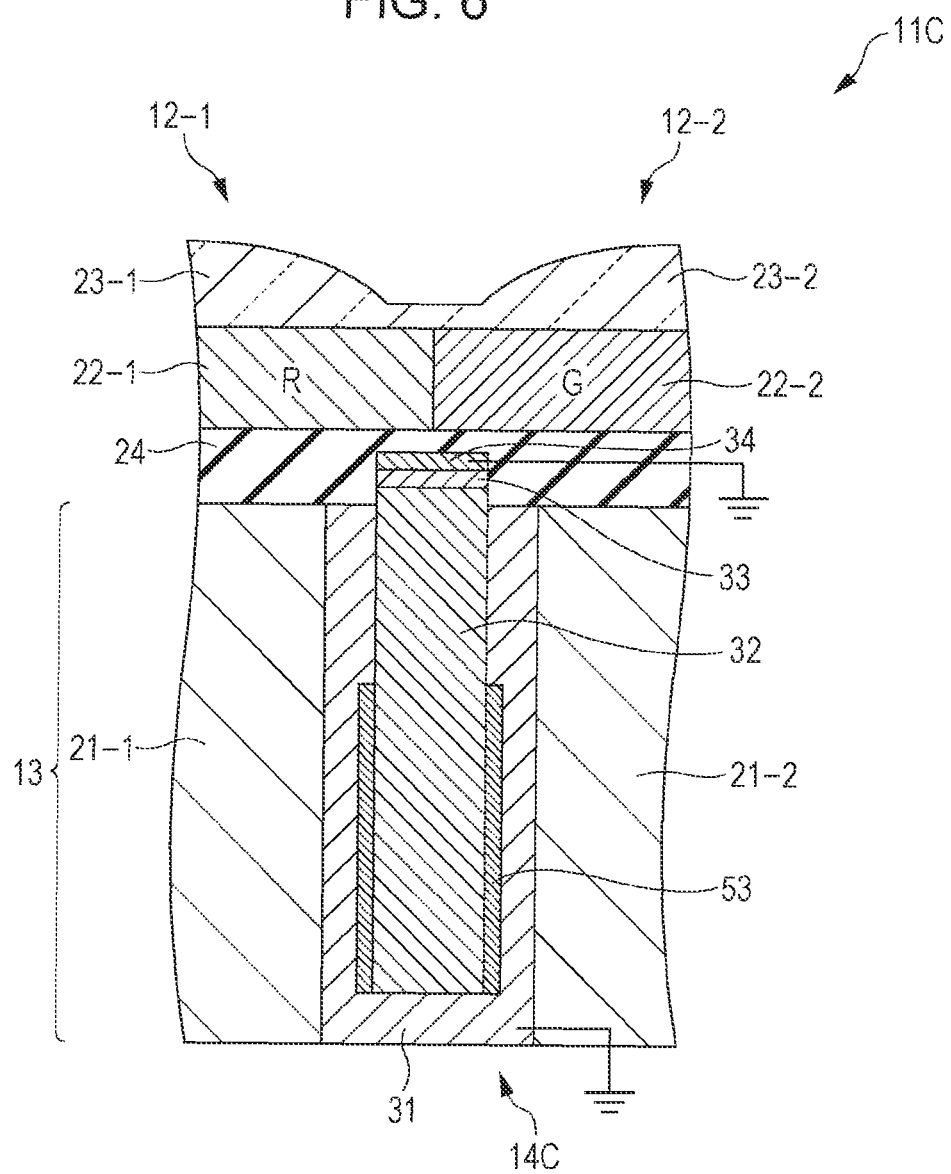
FIG. 6 is a diagram which shows a configuration example of a fourth embodiment of the solid-state imaging element.

Next, FIG. 6 is a diagram which shows a configuration example of a fourth embodiment of the solid-state imaging element 11.

As shown in FIG. 6, a solid-state imaging element 11C has a different configuration from the solid-state imaging element 11 in FIG. 1 in the point that a metal thin film 53 is formed on the trench side wall surface. Here, the other portions of the solid-state imaging element 11C are configured in the same manner as the solid-state imaging element 11 in FIG. 1, the same reference numerals are used for the common components, and detailed description thereof will be omitted.

For example, a pixel separation section 14C of the solid-state imaging element 11C has a configuration where the portion which is deeper than the predetermined depth of the photoelectric conversion film 32 is covered by the metal thin film 53. It is possible to use, for example, tungsten (W), titanium (Ti), tantalum (Ta), or aluminum (Al) for the metal thin film 53 and the metal thin film 53 is formed such that the film thickness is, for example, 30 nm.

In the solid-state imaging element 11C which is configured in this manner, it is possible to absorb the incident light from the oblique direction by photoelectric conversion in the photoelectric conversion film 32 which is exposed at the upper layer side of the pixel separation section 14C and to suppress generation of color mixing. Furthermore, in the solid-state imaging element 11C, it is possible to reflect the light which is incident onto the pixel separation section 14C via the PD 21 again toward the PD 21 using the metal thin film 53. Due to this, it is possible to prevent such light entering the adjacent PD 21 and it is also possible to effectively improve the photoelectric conversion efficiency in the PD 21 by increasing the light path length.

Figure 7A:
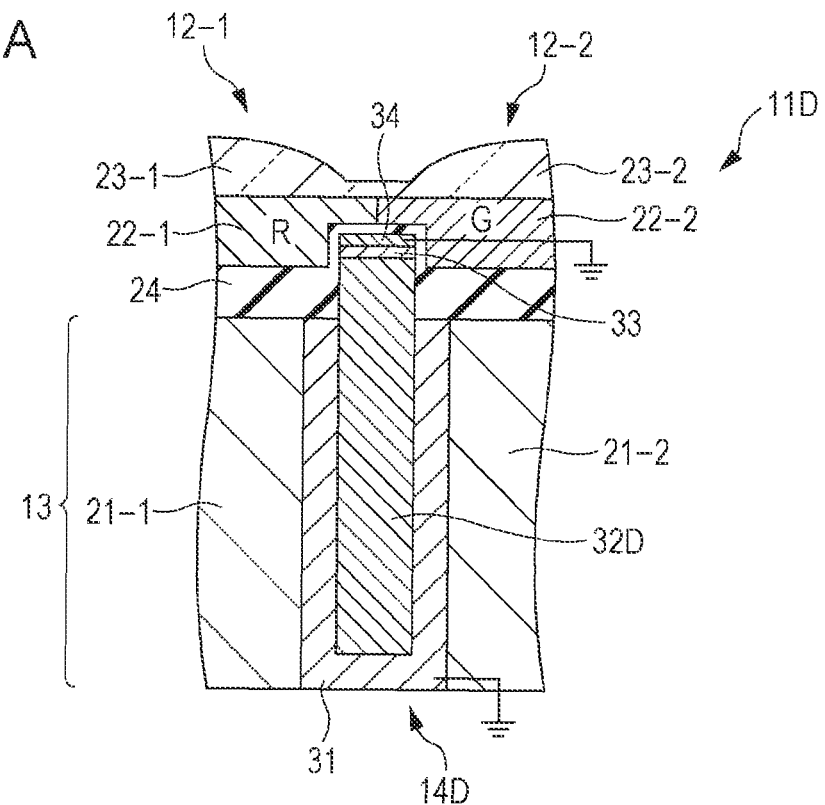
FIGS. 7A and 7B are diagrams which show configuration examples of fifth and sixth embodiments of the solid-state imaging element.
Figure 7B:
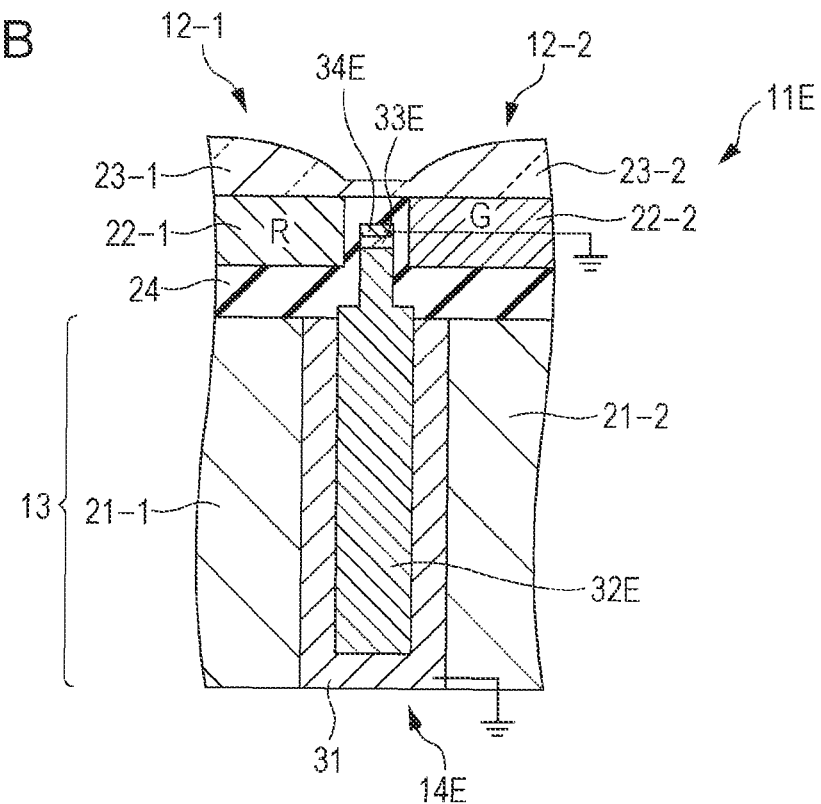

Next, FIGS. 7A and 7B are diagrams which show a configuration example of fifth and sixth embodiments of the solid-state imaging element 11.

As shown in FIGS. 7A and 7B, a solid-state imaging element 11D which is the fifth embodiment and a solid-state imaging element 11E which is the sixth embodiment have a different configuration from the solid-state imaging element 11 in FIG. 1 in the point that pixel separation sections 14D and 14E are structured to protrude from the semiconductor substrate 13 up to the color filter 22. Here, the other portions of the solid-state imaging elements 11D and 11E are configured in the same manner as the solid-state imaging element 11 in FIG. 1, the same reference numerals are used for the common components, and detailed description thereof will be omitted.

For example, in the pixel separation section 14D of the solid-state imaging element 11D, a photoelectric conversion film 32D is formed so as to extend more toward the color filter 22 side than the photoelectric conversion film 32 in FIG. 1 and the pixel separation section 14D is formed to protrude from the semiconductor substrate 13 up to the middle of the color filter 22 in the thickness direction. In addition, in the solid-state imaging element 11D, the width of the photoelectric conversion film 32D in the protruding portion is formed to be the same width as the portion which is filled in the semiconductor substrate 13.

In addition, in the pixel separation section 14E of the solid-state imaging element 11E, a photoelectric conversion film 32E is formed so as to extend more toward the color filter 22 side than the photoelectric conversion film 32 in FIG. 1 and the pixel separation section 14E is formed to protrude until the color filters 22-1 and 22-2 are divided. In addition, in the solid-state imaging element 11E, the width of the photoelectric conversion film 32E in the protruding portion is formed to be a width which is narrower than that of the portion which is filled in the semiconductor substrate 13.

In the solid-state imaging element 11D or 11E which is configured in this manner, it is possible to further improve the obliquely incident resistance and it is possible to reduce color mixing in the color filter 22.

Next, FIG. 8 is a diagram which shows a configuration example of a seventh embodiment of the solid-state imaging element 11.

As shown in FIG. 8, a solid-state imaging element 11F has a different configuration from the solid-state imaging element 11 in FIG. 1 in the point that a driving device 54 is connected between the transparent electrode 34 and the ground. Here, the other portions of the solid-state imaging element 11F are configured in the same manner as the solid-state imaging element 11 in FIG. 1, the same reference numerals are used for the common components, and detailed description thereof will be omitted.

As described above, in the pixel separation section 14, photoelectric conversion is performed in the photoelectric conversion film 32 and it is possible to obtain photovoltaic power due to this.

For example, in the cross structure shown in FIG. 3A, the pixel separation sections 14 which separate each of the pixels 12 are connected in parallel. Accordingly, by integrating a photovoltaic power Pi per pixel 12, it is possible to calculate the total force Pt in the entire solid-state imaging element 11F using the following formula (2).

$$P_t = \Sigma_i P_i \quad (2)$$

In addition, in the divided structure shown in FIG. 3B, it is possible to independently extract electrical power for each of the pixel separation sections 14 which are divided.

In this manner, in the solid-state imaging element 11F, by using the photoelectric conversion film 32 as a so-called solar cell, it is possible to use the electrical power which is extracted to the driving device 54 via the transparent electrode 34, for example, for driving the driving device 54. Due to this, it is possible to achieve a reduction in the electricity consumption of an imaging apparatus (for example, an imaging apparatus 101A in FIG. 16 which will be described below) where the solid-state imaging element 11F is mounted.

Figure 9:
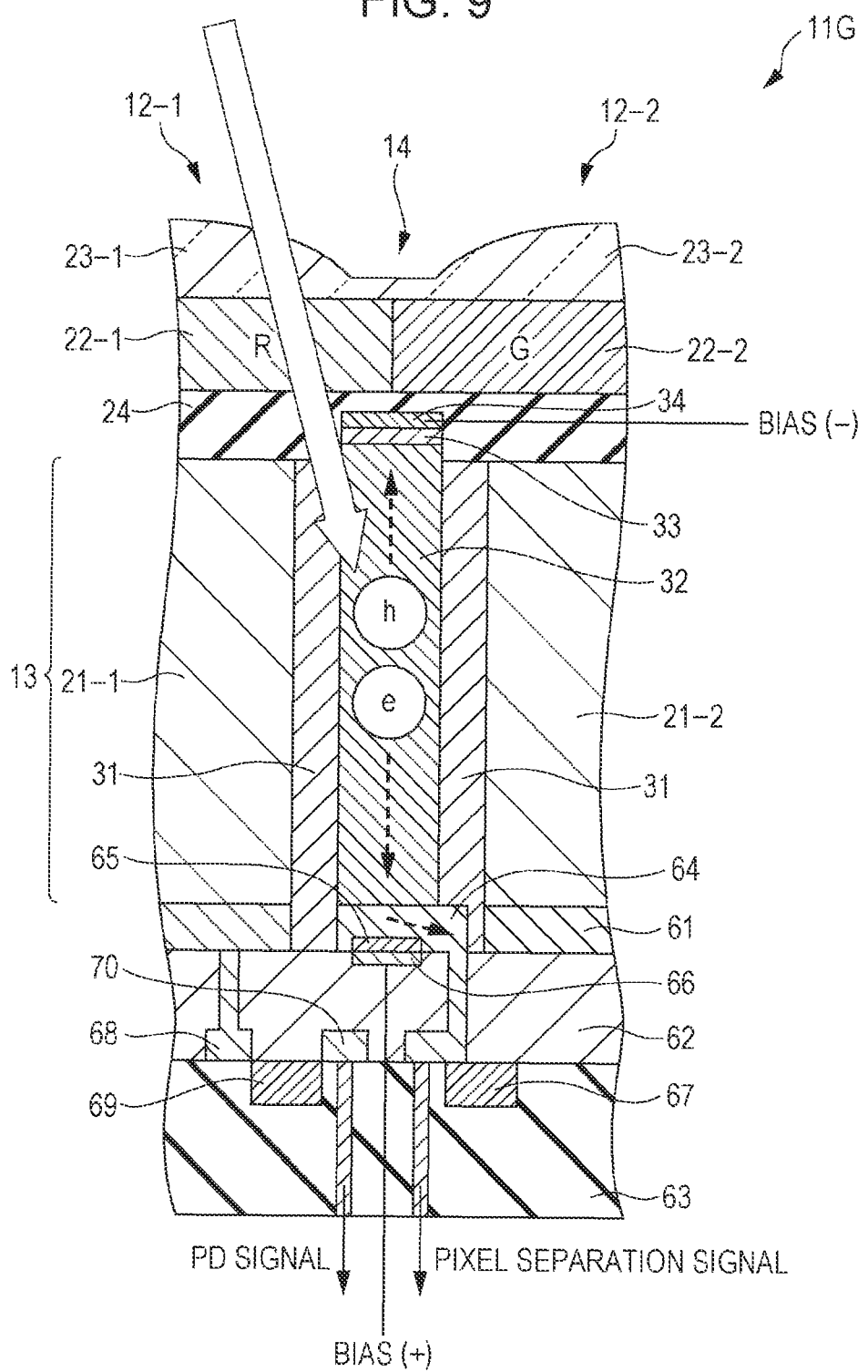
FIG. 9 is a diagram which shows a configuration example of an eighth embodiment of the solid-state imaging element.

Next, FIG. 9 is a diagram which shows a configuration example of an eighth embodiment of the solid-state imaging element 11.

As shown in FIG. 9, a solid-state imaging element 11G has a different structure from the solid-state imaging element 11 in FIG. 1 in the point that the solid-state imaging element 11G is configured such that it is possible to extract electrons which are generated by photoelectric conversion in the photoelectric conversion film 32 as a signal. Here, the other portions of the solid-state imaging element 11G are configured in the same manner as the solid-state imaging element 11 in FIG. 1, the same reference numerals are used for the common components, and detailed description thereof will be omitted. In addition, the solid-state imaging element 11G has a divided structure where the pixel separation sections 14 are divided in a planar configuration as described above with reference to FIG. 3B.

The solid-state imaging element 11G is configured by an epitaxial layer 61, a silicon layer 62, and an insulation layer 63 being laminated on the lower surface of the semiconductor substrate 13 in addition to the structure of the solid-state imaging element 11 in FIG. 1. Furthermore, the solid-state imaging element 11G is configured by the epitaxial layer 61 which comes into contact with the lower surface of the photoelectric conversion film 32 fulfilling a role of a memory section 64, an electronic block layer 65 being formed in the lower surface of the memory section 64, and an electrode 66 being laminated on the lower surface side of the electronic block layer 65. Furthermore, a gate electrode 67 which configures a transfer transistor which transfers electrons from the memory section 64 is formed in a logic section which extracts electrons which are accumulated in the memory section 64.

In addition, a transfer path section 68 which is formed so as to pass from the PD 21 up to the lower surface of the epitaxial layer 61, a gate electrode 69 which configures a transfer transistor which transfers electrons from the PD 21, and a floating diffusion (FD) section 70, which temporarily accumulates an electrical charge which is transferred via the transfer transistor, are formed in the logic section which extracts electrons from the pixel 12.

Furthermore, in the solid-state imaging element 11G, a negative bias is applied to the transparent electrode 34 above the photoelectric conversion film 32 and a positive bias is also applied to the electrode 66 below the photoelectric conversion film 32. Due to this, it is possible to extract photoelectrons and positive holes (holes) which are generated by photoelectric conversion in the photoelectric conversion film 32.

That is, in the solid-state imaging element 11G, it is possible to extract electrons from the electrode 66 in the lower section via a vertical transistor and it is also possible to extract holes from the transparent electrode 34 in the upper section. In this manner, the solid-state imaging element 11G is able to read out the electrons which are generated by photoelectric conversion in the photoelectric conversion film 32 as a signal, separately from the signal of the PD 21.

Next, description will be given of a method for manufacturing the solid-state imaging element 11G with reference to FIG. 10 to FIG. 12. Here, in FIG. 10 to FIG. 12, the surface which faces the lower side in the diagrams is referred to as the surface and the surface which faces the upper side in the diagrams is referred to as the back surface.

Firstly, in an eleventh step (the upper side in FIG. 10), a CMOS logic (the gate electrode 67, the transfer path section 68, the gate electrode 69, and an FD section 70) is created on the surface of the silicon substrate and the insulation layer 63 is laminated. Then, the silicon layer 62 is formed by performing film thinning by chemical mechanical polishing (CMP) from the back surface of the silicon substrate.

Next, in a twelfth step (the center in FIG. 10), a photoresist mask is created by lithography and a shallow trench for forming the electrode 66 is processed by dry etching. Then, the electrode 66 is formed by film-forming ITO or metal (for example, Cu, Al, or the like) in the trench by a sputtering method and further carrying out an etch back process. Subsequently, after an insulation film (for example, $SiO_2$ or SiN) is film-formed on the electrode 66 by CVD and a photoresist mask is formed by lithography, the electronic block layer 65 is formed by dry etching.

Next, in a thirteenth step (the lower side in FIG. 10), the epitaxial layer 61 is formed by epitaxial growth with respect to the back surface of the silicon layer 62. In addition, an N-type doped polysilicon layer may be formed by CVD instead of the epitaxial layer 61. Then, with respect to the epitaxial layer 61, an N+ type doped layer which is the memory section 64 is formed by ion implantation and a P-type doped layer is also formed in the portion which is connected with the P-type doped layer 31 by ion implantation. At this time, the n+ type doped layer favorably has a potential distribution which efficiently draws photoelectrons into a transfer transistor which has the gate electrode 67.

Next, in a fourteenth step (the upper side in FIG. 11), the semiconductor substrate 13 is bonded with respect to the epitaxial layer 61 and the P-type doped layer 31, the insulation film 41, and the trench 42 are formed in the same manner as the first step described with reference to FIG. 4.

Next, in a fifteenth step (the lower side in FIG. 11), the photoelectric conversion film 32 is formed by filling CIGS inside the trench 42 in the same manner as the second step described with reference to FIG. 4. Next, in a sixteenth step (the upper side in FIG. 12), the transparent electrode 34 and the buffer layer 33 are formed in the same manner as the third step described with reference to FIG. 4. Next, in a seventeenth step (the lower side in FIG. 12), the insulation layer 24 is formed by film-forming silicon nitride by CVD and an etch back process is carried out in the same manner as the fourth step described with reference to FIG. 4.

After that, the solid-state imaging element 11G is manufactured by forming the color filter 22 and the microlens 23 as shown in FIG. 9.

Figure 13:
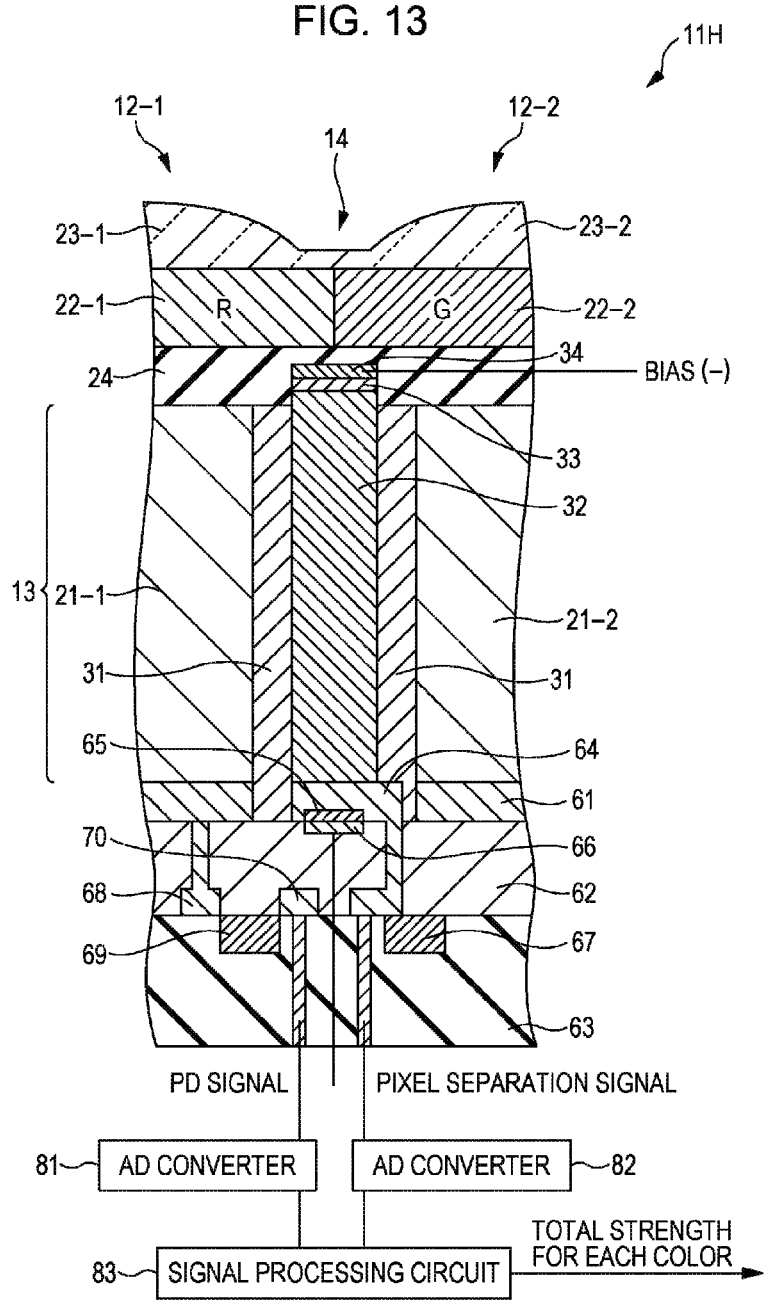
FIG. 13 is a diagram which shows a configuration example of a ninth embodiment of the solid-state imaging element.

Next, FIG. 13 is a diagram which shows a configuration example of a ninth embodiment of the solid-state imaging element 11.

As shown in FIG. 13, a solid-state imaging element 11H is configured such that electrons which are generated in the pixel separation sections 14 are used as a pixel signal in the configuration of the solid-state imaging element 11G shown in FIG. 9. Here, in the solid-state imaging element 11H, the same reference numerals are used for the constituent components which are configured in the same manner as the solid-state imaging element 11G in FIG. 9 and detailed description thereof will be omitted.

For example, the solid-state imaging element 11H is configured by being provided with analog digital (AD) converters 81 and 82 and a signal processing circuit 83 in addition to the configuration of the solid-state imaging element 11G in FIG. 9.

The AD converter 81 carries out AD conversion of a photodiode signal $S_{pd}$ which is read out from the PD 21-1 of the pixel 12-1. The AD converter 82 carries out AD conversion of a pixel separation signal $S_i$ which is read out from the photoelectric conversion film 32 of the pixel separation section 14. Here, the photodiode signal $S_{pd}$ and the pixel separation signal $S_i$ are read out in synchronization.

The signal processing circuit 83 performs signal calculation processing with respect to the photodiode signal $S_{pd}$ which was AD converted by the AD converter 81 and the pixel separation signal $S_i$ which was AD converted by the AD converter 82 and calculates the total strength (the total signal) for each color.

In addition, the signal processing circuit 83 includes a signal calculation processing section and a database. A degree of mixing with respect to a signal strength ratio $S_i/S_{pd}$ between the pixel separation signal $S_i$ and the photodiode signal $S_{pd}$ is registered in database format in the database of the signal processing circuit 83. Here, the degree of mixing with respect to the signal strength ratio $S_i/S_{pd}$ is predicted beforehand by simulation or actual measurement.

Figure 14:
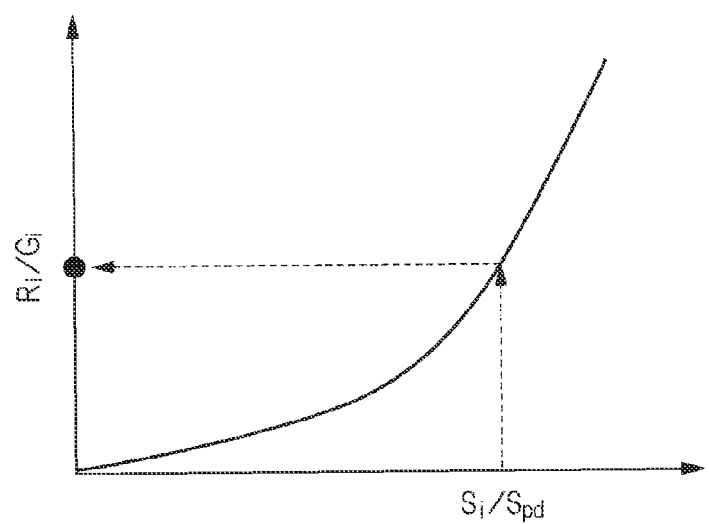
FIG. 14 is a diagram which shows a relationship between a signal strength ratio and a degree of color mixing.

For example, a degree of mixing $R_i/G_i$ for a pixel signal $R_i$ of the red pixel 12-1 and a pixel signal $G_i$ of the green pixel 12-2 with respect to the signal strength ratio $S_i/S_{pd}$ is obtained beforehand and registered in the database of the signal processing circuit 83 as shown in FIG. 14.

Then, the signal calculation processing section of the signal processing circuit 83 obtains a degree of mixing for each color (a color assignment value) by referring to the database using the signal strength ratio $S_i/S_{pd}$ which is obtained from the photodiode signal $S_{pd}$ from the AD converter 81 and the pixel separation signal $S_i$ from the AD converter 82. Furthermore, the signal calculation processing section of the signal processing circuit 83 adds the pixel separation signal $S_i$ of the ratio according to the obtained degree of mixing to the photodiode signal $S_{pd}$ and outputs the total signal. It is possible to improve the sensitivity of the solid-state imaging element 11H by using the total signal for imaging in this manner.

Furthermore, for example, in the solid-state imaging element 11H, it is possible to realize an image surface phase difference autofocus, a tracking function of an object, or the like where changes in the signal strength ratio $S_i/S_{pd}$ are used, by being able to extract shielding components which are not actively used in the related art as a pixel separation signal $S_i$ separately from the photodiode signal $S_{pd}$.

Here, the solid-state imaging element 11 in each of the embodiments described above is able to be applied, for example, to various types of electronic devices such as an imaging system such as a digital still camera or a digital video camera, a cellular phone which is provided with an imaging function, or other devices which are provided with an imaging function.

Figure 15:
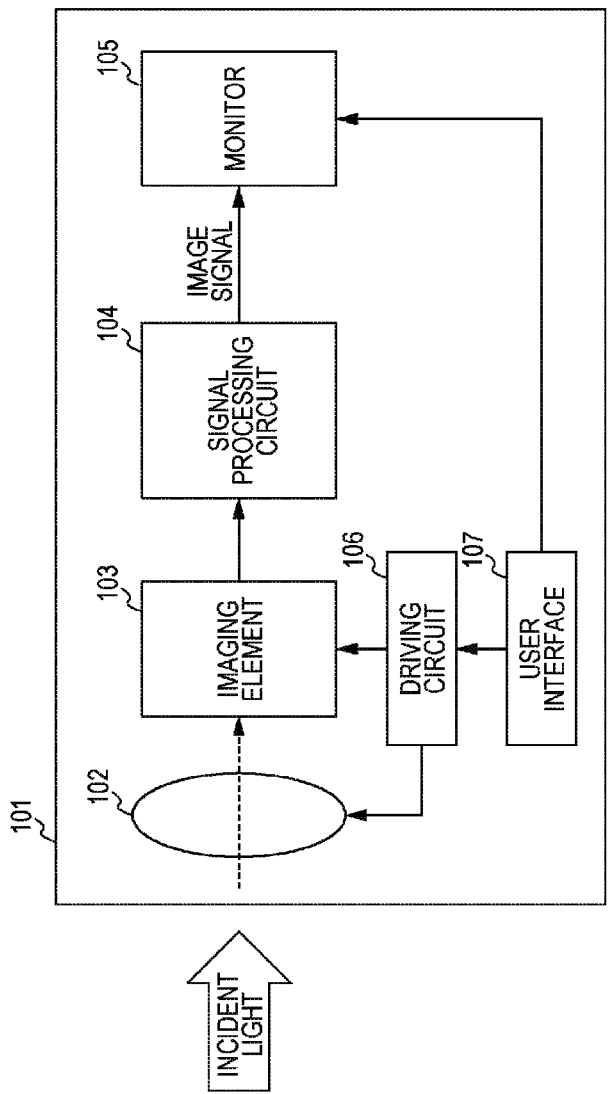
FIG. 15 is a block diagram which shows a first configuration example of an electronic device.

FIG. 15 is a block diagram which shows a first configuration example of an imaging apparatus which is mounted on an electronic device.

As shown in FIG. 15, an imaging apparatus 101 is provided with an optical system 102, an imaging element 103, a signal processing circuit 104, a monitor 105, a driving circuit 106, and a user interface 107 and is able to image static images and moving images.

The optical system 102 has one or a plurality of lenses and focuses image light (incident light) from a subject on the imaging surface of the imaging element 103 by guiding the image light to the imaging element 103.

The solid-state imaging elements 11 in each of the embodiments described above are applied to the imaging element 103. Electrons are accumulated in the imaging element 103 for a certain period according to the image which is focused on the light receiving surface via the optical system 102. Then, the signal according to the electrons which are accumulated in the imaging element 103 is supplied to the signal processing circuit 104. In addition, the imaging element 103 performs a signal transfer in accordance with the driving signal (timing signal) which is supplied from the driving circuit 106.

The signal processing circuit 104 carries out various types of signal processing with respect to the pixel signal which is output from the imaging element 103. Here, the signal processing circuit 104 may be configured to include a function as the signal processing circuit 83 in FIG. 13. The image signal which is obtained by the signal processing circuit 104 carrying out the signal processing is supplied to a memory which is not shown in the diagram and stored (recorded) therein.

The monitor 105 is configured by a liquid crystal display (LCD) or the like and displays an image signal which is output from the signal processing circuit 104.

The driving circuit 106 drives the optical system 102 and the imaging element 103.

The user interface 107 is configured by buttons, a touch panel, or the like, receives the operation from a user, and supplies signals according to the operation thereof to the monitor 105 or the driving circuit 106.

By applying the solid-state imaging element 11 in each of the embodiments described above in the imaging apparatus 101 which is configured in this manner, for example, it is possible to obtain an image with high resolution where generation of color mixing is suppressed.

Figure 16:
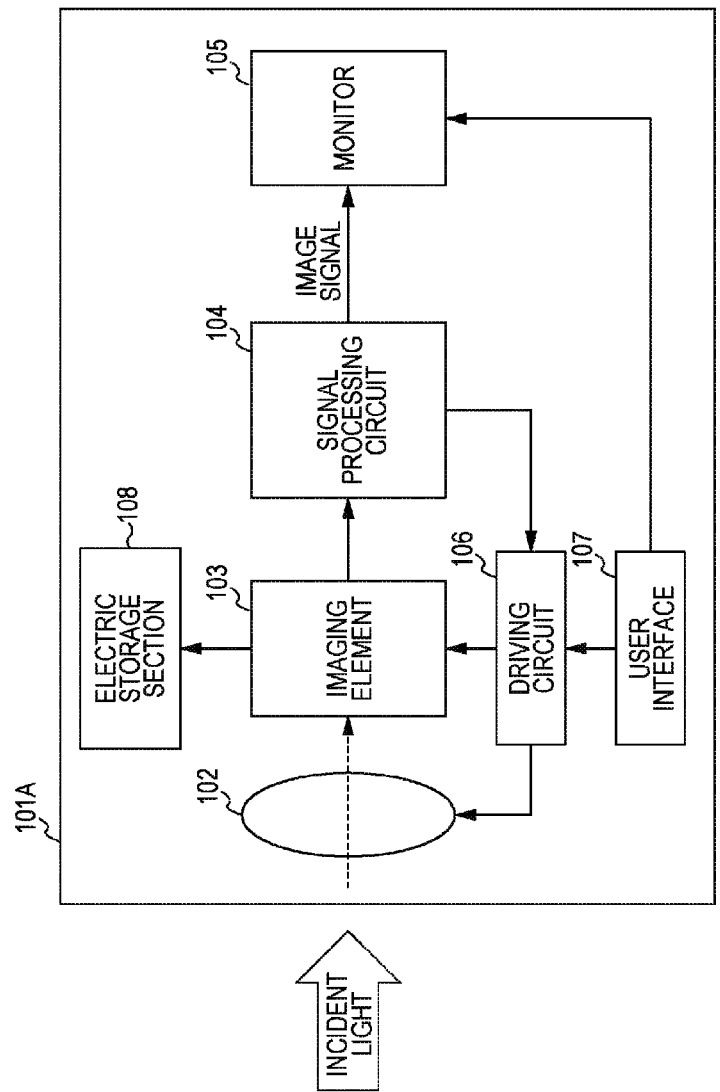
FIG. 16 is a block diagram which shows a second configuration example of the electronic device.

Next, FIG. 16 is a block diagram which shows a second configuration example of an imaging apparatus which is mounted on an electronic device.

The imaging apparatus 101A shown in FIG. 16 has a different configuration from the imaging apparatus 101 in FIG. 15 in the point that the imaging apparatus 101A is provided with an electric storage section 108 and configured such that the signal from the signal processing circuit 104 is supplied to the driving circuit 106. Here, the other portions of the imaging apparatus 101A are configured in the same manner as the imaging apparatus 101 in FIG. 15, the same reference numerals are used for the common components, and detailed description thereof will be omitted.

In the imaging apparatus 101A, the imaging element 103 is configured so as to be able to extract photovoltaic power in the photoelectric conversion film 32 of the pixel separation section 14 and the photovoltaic power is supplied from the imaging element 103 to the electric storage section 108.

It is possible for the electric storage section 108 to accumulate the photovoltaic power which is supplied from the imaging element 103.

In addition, in the imaging apparatus 101A, it is possible for the signal processing circuit 104 to measure the photovoltaic power in the photoelectric conversion film 32 of the pixel separation section 14 and supply the measurement result to the driving circuit 106.

Then, for example, when an operation which designates a charging mode is performed with respect to the user interface 107, the driving circuit 106 identifies the lens position of the optical system 102 such that the photovoltaic power which is measured by the signal processing circuit 104 is maximized according to the operation. Due to this, power generation is performed such that the photovoltaic power in the photoelectric conversion film 32 of the pixel separation section 14 has maximum efficiency and for example, the total force Pt which is obtained by the formula (2) described above is maximized, and electrical power is accumulated in the electric storage section 108.

In addition, when the driving circuit 106 is not in an imaging mode, the optical system 102 may be automatically driven as a charging mode and the photovoltaic power may be accumulated in the electric storage section 108 with maximum efficiency. Here, when the driving circuit 106 is in an imaging mode, the photovoltaic power is obtained by photoelectric conversion in the pixel separation section 14 using the obliquely incident light as it is.

In the imaging apparatus 101A which is configured in this manner, it is possible to obtain an image with high resolution where generation of color mixing is suppressed and it is also possible to achieve a reduction in electrical power by using the photovoltaic power in the photoelectric conversion film 32 of the pixel separation section 14 for driving.

Here, in the present embodiment, description is given of the imaging apparatus 101; however, for example, it is possible to apply the solid-state imaging element 11 in each of the embodiments described above to typical electronic devices, such as an endoscope, a vision chip (artificial retina), a biosensor, or the like which image light (electromagnetic waves).

Furthermore, it is possible to apply the solid-state imaging element 11 to both a back surface irradiation type CMOS image sensor and a front surface irradiation type CMOS image sensor (except for the solid-state imaging elements 11G and 11H). In addition, the solid-state imaging element 11 may be applied to a CCD type image sensor.

Here, the present technique is able to adopt the following configurations.

(1) A solid-state imaging element including a semiconductor substrate where a plurality of photodiodes are arranged in a plane, and a separation section which separates the photodiodes, in which the separation section has a photoelectric conversion section formed by filling a material which has a high light absorption coefficient and a high quantum efficiency in trenches which are formed in the semiconductor substrate.

(2) The solid-state imaging element according to (1), in which the material which is filled in the trenches is a compound semiconductor which has a chalcopyrite structure or a group III-V compound semiconductor.

(3) The solid-state imaging element according to (1) or (2) in which the separation section also has a transparent electrode which is laminated on an upper section of the photoelectric conversion section and a P-type doped layer which is provided so as to cover side surfaces and a bottom surface of the photoelectric conversion section, and the transparent electrode and the P-type doped layer are both connected with the ground.

(4) The solid-state imaging element according to (3), further including a driving device where photoelectrons which are generated in the photoelectric conversion section by photoelectric conversion using the incident light which is incident onto the separation section are taken out via the transparent electrode and positive holes which are generated in the photoelectric conversion section are taken out via the P-type doped layer at the same time, and which uses photovoltaic power taken out from the photoelectric conversion section for driving.

(5) The solid-state imaging element according to (3) or (4), in which the separation section further has a buffer layer which is laminated between the photoelectric conversion section and the transparent electrode.

(6) The solid-state imaging element according to any of (1) to (5), in which the photoelectric conversion section is formed in a portion which is shallower than a predetermined depth of the trenches, and any of an insulation film, a metal film, or an organic film is filled in the portion which is deeper than the predetermined depth of the trenches.

(7) The solid-state imaging element according to (6), in which the depth of the portion where the photoelectric conversion section is formed is 400 nm or more.

(8) The solid-state imaging element according to any of (1) to (5), in which the separation section further has a metal thin film which covers side surfaces of the photoelectric conversion section in the portion which is deeper than the predetermined depth of the photoelectric conversion section.

(9) The solid-state imaging element according to any of (1) to (8), in which an insulation layer and a color filter are laminated on the semiconductor substrate, and the separation section is formed to protrude from the semiconductor substrate up to the middle of the color filter in the thickness direction so as to extend from the semiconductor substrate toward the color filter side, or to protrude from the semiconductor substrate until the color filter is divided.

(10) The solid-state imaging element according to (1) or (2), in which the separation section further has a transparent electrode which is arranged above the photoelectric conversion section and applies a negative bias, an electrode which is arranged below the photoelectric conversion section and applies a positive bias, a memory section which is arranged between the photoelectric conversion section and the electrode and which stores photoelectrons which are generated in the photoelectric conversion section by photoelectric conversion using the incident light which is incident onto the separation section, and a gate electrode which configures a transfer transistor which takes out the photoelectrons which are stored in the memory section as a signal.

(11) The solid-state imaging element according to (10), further including a signal processing circuit which performs signal processing which, based on a signal strength ratio which is the ratio of a photodiode signal which is a signal read out from the photodiode and a pixel separation signal which is a signal read out from the photoelectric conversion section and a database where a degree of mixing which corresponds to the signal strength ratio is predicted beforehand by simulation or actual measurement and registered, determines the mixing ratio when the pixel separation signal is added to the photodiode signal and adds the pixel separation signal to the photodiode signal at a ratio in accordance with the degree of mixing.

(12) A method for manufacturing a solid-state imaging element which is provided with a semiconductor substrate where a plurality of photodiodes are arranged in a plane and a separation section which separates the photodiodes, the method including forming trenches in the semiconductor substrate when forming the separation section, and forming a photoelectric conversion section by filling a material which has a high light absorption coefficient and a high quantum efficiency in the trenches.

(13) An electronic device including a solid-state imaging element which is provided with a semiconductor substrate where a plurality of photodiodes are arranged in a plane, and a separation section which separates the photodiodes, in which the separation section has a photoelectric conversion section formed by filling a material which has a high light absorption coefficient and a high quantum efficiency in trenches which are formed in the semiconductor substrate.

(14) The electronic device according to (13), in which the material which is filled in the trenches is a compound semiconductor which has a chalcopyrite structure or a group III-V compound semiconductor.

(15) The electronic device according to (13) or (14), in which the separation section also has a transparent electrode which is laminated on an upper section of the photoelectric conversion section and a P-type doped layer which is provided so as to cover side surfaces and a bottom surface of the photoelectric conversion section, and the transparent electrode and the P-type doped layer are both connected with the ground.

(16) The electronic device according to (15), further including a driving device where photoelectrons which are generated in the photoelectric conversion section by photoelectric conversion using the incident light which is incident onto the separation section are taken out via the transparent electrode and positive holes which are generated in the photoelectric conversion section are taken out via the P-type doped layer at the same time, and which uses photovoltaic power taken out from the photoelectric conversion section for driving.

(17) The electronic device according to (16), further including a charging section which charges photovoltaic power taken out from the photoelectric conversion section, and a driving circuit which drives an optical system which focuses the incident light with respect to the solid-state imaging element such that the photovoltaic power is maximized in the photoelectric conversion section when a mode for performing charging is specified in the charging section.

Here, the present embodiments are not limited to the embodiments described above and various changes are possible in a range which does not depart from the gist of the present disclosure.

What is claimed is:

1. A solid-state imaging element comprising:
  a semiconductor substrate where a plurality of photodiodes are arranged in a plane; and
  a separation section which separates the photodiodes,
  wherein the separation section has a photoelectric conversion section formed by filling a material which has a high light absorption coefficient and a high quantum efficiency in trenches which are formed in the semiconductor substrate.

2. The solid-state imaging element according to claim 1, wherein the material which is filled in the trenches is a compound semiconductor which has a chalcopyrite structure or a group III-V compound semiconductor.

3. The solid-state imaging element according to claim 1, wherein the separation section also has a transparent electrode which is laminated on an upper section of the photoelectric conversion section and a P-type doped layer which is provided so as to cover side surfaces and a bottom surface of the photoelectric conversion section, and the transparent electrode and the P-type doped layer are both connected with the ground.

4. The solid-state imaging element according to claim 3, further comprising:

a driving device where photoelectrons which are generated in the photoelectric conversion section by photoelectric conversion using the incident light which is incident onto the separation section are taken out via the transparent electrode and positive holes which are generated in the photoelectric conversion section are taken out via the P-type doped layer at the same time, and which uses photovoltaic power taken out from the photoelectric conversion section for driving.

5. The solid-state imaging element according to claim 3, wherein the separation section further has a buffer layer which is laminated between the photoelectric conversion section and the transparent electrode.

6. The solid-state imaging element according to claim 1, wherein the photoelectric conversion section is formed in a portion which is shallower than a predetermined depth of the trenches, and any of an insulation film, a metal film, or an organic film is filled in a portion which is deeper than the predetermined depth of the trenches.

7. The solid-state imaging element according to claim 6, wherein the depth of the portion where the photoelectric conversion section is formed is 400 nm or more.

8. The solid-state imaging element according to claim 1, wherein the separation section further has a metal thin film which covers side surfaces of the photoelectric conversion section in a portion which is deeper than a predetermined depth of the photoelectric conversion section.

9. The solid-state imaging element according to claim 1, wherein an insulation layer and a color filter are laminated on the semiconductor substrate, and the separation section is formed to protrude from the semiconductor substrate up to the middle of the color filter in the thickness direction so as to extend from the semiconductor substrate toward a color filter side, or to protrude from the semiconductor substrate until the color filter is divided.

10. The solid-state imaging element according to claim 1, wherein the separation section further has a transparent electrode which is arranged above the photoelectric conversion section and applies a negative bias, an electrode which is arranged below the photoelectric conversion section and applies a positive bias, a memory section which is arranged between the photoelectric conversion section and the electrode and which stores photoelectrons which are generated in the photoelectric conversion section by photoelectric conversion using the incident light which is incident onto the separation section, and a gate electrode which configures a transfer transistor which takes out the photoelectrons which are stored in the memory section as a signal.

11. The solid-state imaging element according to claim 10, further comprising:

a signal processing circuit which performs signal processing which, based on a signal strength ratio which is the ratio of a photodiode signal which is a signal read out from the photodiode and a pixel separation signal which is a signal read out from the photoelectric conversion section and a database where a degree of mixing which corresponds to the signal strength ratio is predicted beforehand by simulation or actual measurement and registered, determines the mixing ratio when the pixel separation signal is added to the photodiode signal and adds the pixel separation signal to the photodiode signal at a ratio in accordance with the degree of mixing.

12. A method for manufacturing a solid-state imaging element which is provided with a semiconductor substrate where a plurality of photodiodes are arranged in a plane and a separation section which separates the photodiodes, the method comprising:

forming trenches in the semiconductor substrate when forming the separation section; and forming a photoelectric conversion section by filling a material which has a high light absorption coefficient and a high quantum efficiency in the trenches.

13. An electronic device comprising:

a solid-state imaging element which is provided with a semiconductor substrate where a plurality of photodiodes are arranged in a plane, and a separation section which separates the photodiodes, wherein the separation section has a photoelectric conversion section formed by filling a material which has a high light absorption coefficient and a high quantum efficiency in trenches which are formed in the semiconductor substrate.

14. The electronic device according to claim 13, wherein the material which is filled in the trenches is a compound semiconductor which has a chalcopyrite structure or a group III-V compound semiconductor.

15. The electronic device according to claim 13, wherein the separation section also has a transparent electrode which is laminated on an upper section of the photoelectric conversion section and a P-type doped layer which is provided so as to cover side surfaces and a bottom surface of the photoelectric conversion section, and the transparent electrode and the P-type doped layer are both connected with the ground.

16. The electronic device according to claim 15, further comprising:

a driving device where photoelectrons which are generated in the photoelectric conversion section by photoelectric conversion using incident light which is incident onto the separation section are taken out via the transparent electrode and positive holes which are generated in the photoelectric conversion section are taken out via the P-type doped layer at the same time, and which uses photovoltaic power taken out from the photoelectric conversion section for driving.

17. The electronic device according to claim 16, further comprising:

a charging section which charges photovoltaic power taken out from the photoelectric conversion section; and a driving circuit which drives an optical system which focuses the incident light with respect to the solid-state imaging element such that the photovoltaic power is maximized in the photoelectric conversion section when a mode for performing charging is specified in the charging section.

* * * * *